US005610516A

United States Patent [19]

Maier

[11] Patent Number: 5,610,516

[45] Date of Patent: Mar. 11, 1997

[54] PROCESS OF AND DEVICE FOR CHECKING PRESENCE OF METAL IN REFUSE CONTAINER OF REFUSE COLLECTING VEHICLE

[76] Inventor: Hans-Jürgen Maier, Lembergstrasse 17, D-7400, Tübingen 1, Germany

[21] Appl. No.: 313,293

[22] PCT Filed: Mar. 30, 1993

[86] PCT No.: PCT/EP93/00763

§ 371 Date: Oct. 4, 1994

§ 102(e) Date: Oct. 4, 1994

[87] PCT Pub. No.: WO93/19999

PCT Pub. Date: Oct. 14, 1993

[30] Foreign Application Priority Data

Jun. 4, 1992 [DE] Germany .......................... 42 11 545.0

[51] Int. Cl.$^{6}$ ............................ G01N 27/72; B65F 3/02; G01R 33/00

[52] U.S. Cl. .............................................................. 324/226

[58] Field of Search .................................... 324/226, 228, 324/234, 236, 262, 326, 327, 328, 329

[56] References Cited

U.S. PATENT DOCUMENTS

| | | | |
|---|---|---|---|
| 4,742,339 | 5/1988 | Baziuk | 324/228 |
| 5,444,966 | 8/1995 | Strosser | 324/243 |

*Primary Examiner*—Walter E. Snow
*Attorney, Agent, or Firm*—Michael J. Striker

[57] ABSTRACT

The description relates to a process and a device for checking for the presence of metal in refuse contained in a refuse container. To check the contents of a refuse container (12), the latter is scanned by at least one metal detector (15) at the pick-up site before being emptied and an electric and/or acoustic and/or optical signal is generated when metal is detected.

22 Claims, 2 Drawing Sheets

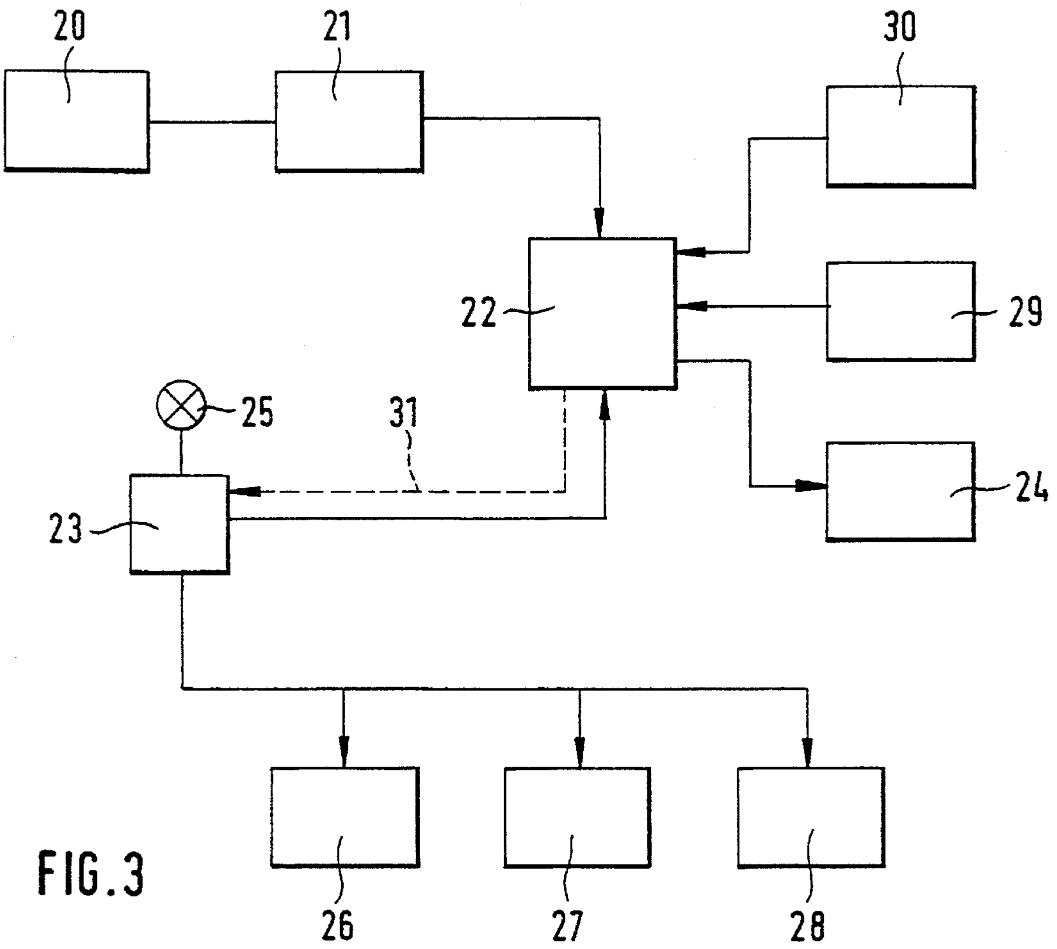
FIG.3
FIG.4
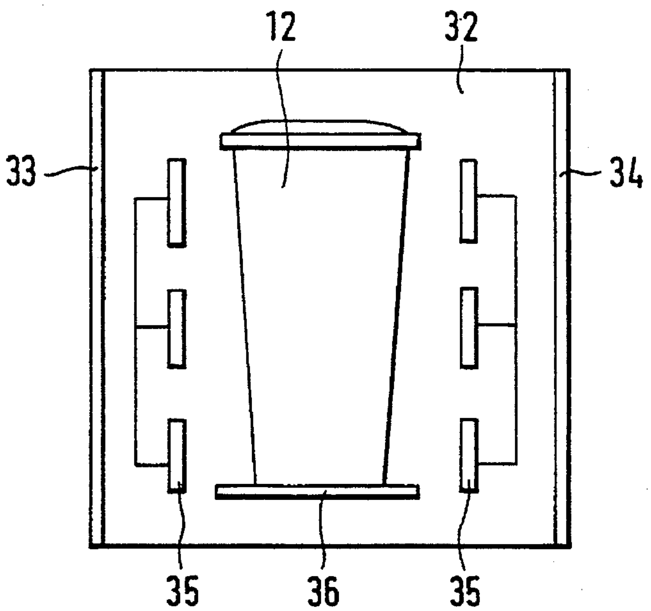

PROCESS OF AND DEVICE FOR CHECKING PRESENCE OF METAL IN REFUSE CONTAINER OF REFUSE COLLECTING VEHICLE

DESCRIPTION

The invention is directed to a process and a device for checking for the presence of metal in refuse contained in a refuse container.

At present, domestic refuse and commercial refuse, respectively, is still often deposited in a single receptacle without sorting and is disposed of in dumps or landfills or burned in waste incineration plants. A particular problem is posed by metallic waste because of its material composition, in particular its content of heavy metals, and because of paint and solvent residues and other chemicals, for example, which are found especially in metal cans or spray cans. From landfills, the heavy metals and chemicals find their way into groundwater or surface water and contaminate this water. Waste incineration plants can produce toxic waste gases from the metal waste. These gases cannot be completely filtered out before being released into the atmosphere, even by expensive cleaning processes. In view of this, it is desirable for ecological reasons to collect and dispose of at least metallic waste separately from other types of refuse. Also because of the scarcity of raw materials, it is important to collect different types of refuse separately and recycle them, particularly glass, paper, organic waste capable of composting, and scrap metal. However, such materials can only be recycled profitably if the refuse is homogeneous and does not require sorting before recycling. This is particularly true for organic refuse which must be free of heavy metals before being added to a compost for agricultural uses. On the other hand, production of compost represents the most important means of relieving progressively dwindling landfill capacities.

The simplest way to ensure homogeneous refuse consists in a thoroughly sorted collection of individual types of refuse on the part of the producers of the refuse, i.e., the households and commercial operations themselves. Environmental awareness on the part of the population has indeed increased sharply in recent years. However, refuse is often not sorted with sufficient thoroughness due to laziness or carelessness. Metal contained in refuse containers for special waste not intended to hold metallic materials is particularly disturbing for the reasons stated above.

The object of the present invention is to provide the possibility to check refuse for contained metal already at the pick-up site.

This object is met according to the invention by a process of the type mentioned above in that the refuse container is scanned by at least one metal detector at the pick-up site before being emptied and in that an electric and/or acoustic and/or optical signal is generated when metal is detected. In so doing, the metal detector, of which there is at least one, can produce a pulsed or continuous eddy current field or it can irradiate the refuse container with electromagnetic waves. Accordingly, the process according to the invention can reliably determine whether or not metallic material has been thrown into the refuse bins of a household or commercial establishment. In a first step for accustoming the population to collecting metal refuse separately, stickers containing a reminder for environmental awareness could be affixed to refuse bins in which metal has been detected in order to encourage the refuse producer to separate different types of refuse more thoroughly. In a follow-up to this first phase, it would be possible to refuse to continue emptying refuse bins in which metal is detected. When refuse is picked up by a vehicle provided with at least one lifting device for refuse containers, detection of metal by the detector can trigger a locking of the lifting device so as to prevent the waste disposal personnel from unintentionally emptying a refuse bin containing metal. A further possibility for motivating the population to collect different types of refuse in separate containers consists in charging a sharply higher fee when metal waste is detected in the refuse bins. For this purpose, a readable code identifying the refuse producer can be arranged on the refuse container and the number of times that metal has been detected within a certain time span can be stored for each refuse producer. The refuse producer will then receive quarterly or biannual invoices which include penalty charges whose amount depends on the number of times that metal is detected in his/her refuse bins. The opposite strategy is also conceivable, i.e., to lower refuse removal charges for a thorough sorting out of metallic waste. In particular, removal charges for organic garbage could also be reduced below charges for other refuse by the process according to the invention. Misuse of organic waste containers to hold other types of refuse containing metallic materials which cannot be accommodated in compost formation can be reliably prevented by monitoring directly at the pick-up site before emptying the organic waste container.

The device for checking for metallic material in waste collected in containers has at least one metal detector and a display device and can be arranged, for example, on a refuse collecting vehicle. At least one metal detector and the display device can advisably be connected to the power supply of the refuse collecting vehicle. The arrangement of the metal detector or detectors on the refuse collecting vehicle ensures that they will be brought along and used on each trip of the refuse collecting vehicle. At least one metal detector can be arranged on the refuse collecting vehicle so as to be removable and the refuse containers can be checked manually by passing the detector or detectors along the outside of the container. This is a very economical solution which can be retrofitted on any refuse collecting vehicle or any other vehicle for carrying out random checks. A more convenient solution consists in arranging at least one metal detector on the refuse collecting vehicle in the region of a lifting device for lifting the container or on the lifting device itself. In this way, the refuse containers are automatically checked for metal when picked up on the vehicle so that this need no longer be carried out manually. Accordingly, all refuse containers are also monitored completely in an objective manner without errors so as to prevent any sense of unfair persecution on the part of individual refuse producers which could result from random checks. At least one metal detector can be carried along on the refuse collecting vehicle or lifting device so as to be movable so that it can be passed over the outside of the refuse container at least partially. The metal detector can also be coupled with the drive unit of a lifting device of the refuse collecting vehicle so that the latter is locked when a metal object is detected in the refuse container and an emptying of the refuse container is prevented. There are different possible embodiment forms for the metal detector, of which there is at least one. It may be constructed in an annular shape with a diameter which is greater than the outer diameter of the refuse container. It can accordingly surround the entire circumference of the refuse container and be passed along the length of the container to check its contents. In another embodiment form, the metal detector is constructed in the shape of a rod, the length of the rod corresponding at least to the height of the refuse container. In this way, the contents of the refuse container can be checked for metallic objects by moving the detector horizontally along at least one outer side of the refuse container. The detectors can also be constructed in the form of a hoop and disposed parallel to the sides of the refuse container. A dish-shaped construction of the metal detectors is also possible. Moreover, the detectors described above can be constructed as battery-operated devices for mobile use or can be arranged on special monitoring vehicles to carry out random checks on refuse containers which are not being emptied or picked up. The container contents can also be checked by a stationary metal detector arranged particularly on a refuse collecting vehicle by moving the container relative to the metal detector. In particular, when metal detectors are arranged at a vehicle so as to be stationary, devices for compensating for the influence of metallic objects outside of the refuse container can advantageously be provided to prevent interference, e.g., due to the vehicle which is itself, of course, extensively made of metal. Such compensating devices may be purely passive shielding devices or active compensating coils, for example.

Moreover, the device can be adjusted with respect to the sensitivity of the metal detectors and with respect to their selective response to certain types of metal.

In order to associate the results of the check with particular refuse producers, the device can have a reading device for reading a user code arranged on a refuse container. The reading device and the metal detector can be connected with a computer equipped with memory for postponed evaluation of data. Further, it is possible to provide the device with a label dispensing device so that stickers bearing a reminder to sort refuse can be affixed to refuse containers containing metallic material in the refuse. In a further development of the device according to the invention, the extent to which refuse is contaminated with metallic material and the type of metal contaminant can also be determined for each refuse producer and taken into account when calculating charges. In refuse collecting vehicles with a plurality of chambers for receiving different types of refuse, a switching mechanism may be actuated when metal is detected in a refuse container to ensure that the contents of this container are deposited in a chamber for refuse other than organic waste rather than in the chamber for organic waste for which special requirements are set with respect to purity for production of compost. In this way, containers for organic waste and containers for other types of waste can be emptied in one trip. A code on the refuse container indicates the type of refuse and the metal detector reports any metallic impurities that may be contained in an organic waste container. If a user identification code is also arranged on the refuse container, any impurities found in the container can be taken into account when calculating charges and the user is notified by affixing a label to the refuse container.

Preferred embodiment forms are explained more fully in the following with reference to the drawings.

FIG. 3 shows a block diagram of the electronic components of a device according to the invention;

FIG. 4 shows a schematic view of a device with a shielding device.

Figure 1:
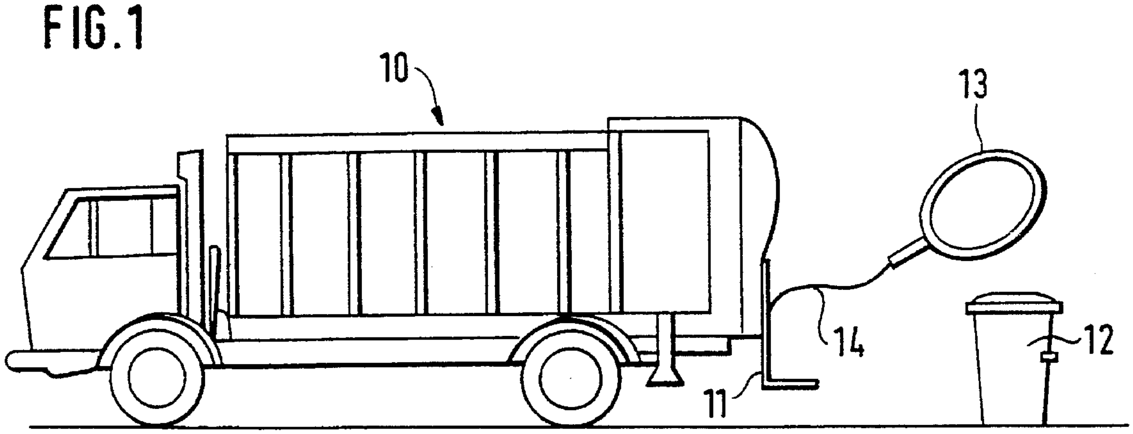
FIG. 1 shows a schematic view of a first device.

FIG. 1 shows a refuse collecting vehicle 10 with a lifting device 11 for a refuse container 12. A metal detector 13 is arranged at the rear end of the refuse collecting vehicle 10.

It is connected with the power supply of the refuse collecting vehicle 10 via a power cable 14. The detector 13 can be removed from a holder (not shown) on the vehicle 10, placed over the refuse container 12 and moved along the length of the container 12 so that the entire contents of the container 12 can be examined for metallic objects. For this purpose, the detector 13 has an annular shape with an opening whose diameter is greater than that of the refuse container 12. The detector 13 can generate a continuous or pulsed eddy current field or can irradiate the refuse container 12 with electromagnetic waves.

Figure 2:
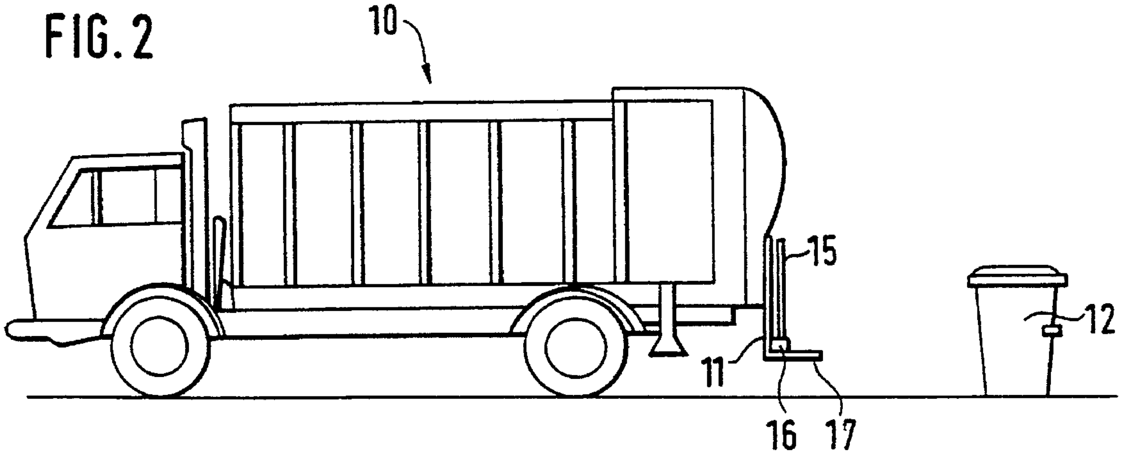
FIG. 2 shows a schematic view of a second device.

In contrast, the metal detector 15 shown in FIG. 2 is constructed in the shape of a rod and is arranged at the lifting device 11 of the refuse collecting vehicle 10 so as to be nonremovable. The lower end of the detector 15 is arranged in a rail 16 so as to be displaceable vertically to the drawing plane. When the refuse container 12 is picked up on the base plate 17 of the lifting device 11, the metal detector 5 is moved horizontally along the front side of the refuse container 12 and the contents of the container 12 are searched for metallic objects. Instead of the rod-shaped metal detector 15, a stationary arrangement of an annular detector similar to that shown in FIG. 1 could also be arranged at the lifting device 11. The ring of the metal detector could be arranged parallel to the base plate 17 at a distance from the latter greater than the height of the refuse container 12 and moved along the container 12 in a vertical direction as soon as the container 12 has been received on the base plate 17. In addition, reading devices for reading a user code or a code arranged on the refuse container 12 for identifying the type of refuse collected in the container can be arranged on the lifting device 11 or on the vehicle 10. A reading device of this kind, e.g., a reading pencil or camera, is designated by reference number 20 in the block diagram in FIG. 3. The code picked up by it is decoded in a decoding device 21 and entered into a computer 22. Further, the signal from a metal detector 23 is fed to the computer 22, appended to the information concerning the user of the refuse bin which has just been checked, and stored in memory 24. The stored data can be evaluated subsequently when calculating charges for refuse removal. Producers of refuse who have not systematically separated the metallic waste from other refuse are charged higher rates depending on the number of times metallic waste has been detected. In addition, the metal detector 2 is connected with a display device, in this case an indicator light 25, which lights up whenever metallic objects are discovered in the refuse container by the metal detector 23. In this way, it is also possible to check the contents of individual refuse bins for metal visually. Further, the metal detector 23 is connected with a drive unit 26 of a lifting device of a refuse collecting vehicle so as to prevent the container from being emptied when metallic waste is detected. When a device according to the invention is arranged at a refuse collecting vehicle with a plurality of chambers, the metal detector 23 can also be connected with a switching mechanism 27 so that the contents of the respective container can be diverted to the chamber for refuse other than organic waste when metal is detected. Moreover, a label dispensing device 28 is connected with the metal detector 23 so that refuse containers containing metal can be appropriately marked and their users requested to separate the refuse.

The computer 22 is connected with an input unit 29 which can be used to pre-select the sensitivity of the metal detector 23 and its selective reaction to certain types of metals. The corresponding information is fed from the computer 22 to the metal detector 23 via a line 31 shown in dashes. The sensitivity and selective response of the metal detector 23 can also be set by push-buttons on the detector itself or by a magnetic card or a plug-in module.

The computer and all other components of the device are connected with a power supply 30 of a refuse collecting vehicle.

FIG. 4 is a schematic view of another embodiment example of a device for detecting metal in the contents of a refuse container 12 with a shielding plate 32 which is bent laterally. A total of six dish-shaped metal detectors 35 are arranged on the right and left sides between the lateral skirts 33 and 34 of the shielding plate 32 so as to face one another in groups of three. The refuse container 12 is moved past the detectors 35 via a base plate 36 in a manner not shown in more detail so that its entire contents can be checked for metal. The device according to FIG. 4 can also be arranged on a refuse collecting vehicle in the region of the lifting device and the shielding plate 32 can reliably prevent interference due to metal components of the refuse collecting vehicle.

I claim:

1. Process for checking for the presence of metal in refuse contained in a refuse container of a refuse collecting vehicle (12), characterized in that refuse is picked up by the refuse collecting vehicle provided with at least one metal detector, the refuse container (12) is scanned by the at least one metal detector (13, 15) provided on the refuse collecting vehicle at the pick-up site before being emptied and in that a signal is generated when metal is detected.

2. Process according to claim 1, characterized in that a pulsed or continuous eddy current field is generated by the metal detector (13, 15), of which there is at least one.

3. Process according to claim 1, characterized in that the refuse container (12) is irradiated with electromagnetic waves by the metal detector (13, 15), of which there is at least one.

4. Device for checking for metal contained in refuse collected in containers of a refuse collecting vehicle, characterized in that it has means for connecting the device to the refuse collecting vehicle, at least one metal detector (13, 15) arranged on the refuse collecting vehicle for detecting metals, and a display device (25).

5. Device for checking for metal contained in refuse collected in containers, characterized in that it has at least one metal detector (13, 15) and a display device (25), and it is arranged on a refuse collecting vehicle (10).

6. Device for checking for metal contained in refuse collected in containers, characterized in that it has at least one metal detector (13, 15) and a display device (25), and it has a reading device (20) for reading a user code and/or refuse type identification code on a refuse container (12).

7. Device according to claim 5, characterized in that the metal detector (13, 15) and the display device (25) can be connected to the power supply of the refuse collecting vehicle.

8. Device according to claim 5, characterized in that at least one metal detector (13) is arranged on the refuse collecting vehicle (10) so as to be removable.

9. Device according to claim 5, characterized in that the metal detector (15) is arranged on the refuse collecting vehicle (10) in the region of a lifting device (11) for lifting the container or on the lifting device (11) itself.

10. Device according to claim 9, characterized in that at least one metal detector (15) is carried along on the refuse collecting vehicle (10) or lifting device (11 ) so as to be movable.

11. Device according to claim 5, characterized in that the metal detector (15), of which there is at least one, is coupled with the drive unit of a lifting device (11) of the refuse collecting vehicle (10).

12. Device according to claims 4, characterized in that the metal detector (13), of which there is at last one, is constructed in an annular shape with a diameter which is greater than the outer diameter of the refuse container (12).

13. Device according to claim 4, characterized in that the metal detector (15), of which there is at least one, is constructed in the shape of a rod, the length of the rod corresponding at least to the height of the refuse container (12).

14. Device according to claim 4, characterized in that the metal detector (15), of which there is at least one, is dish-shaped.

15. Device according to claim 4, characterized in that it has devices (32) for compensating for the influence of metallic objects outside of the refuse container (12).

16. Device according to claim 6, characterized in that the reading device (20) and the metal detector (23), of which there is at least one, is connected with a computer (22) equipped with memory (24).

17. Device according to claim 4, characterized in that it is connected with a label dispensing device (28).

18. Device according to claim 4, characterized in that the sensitivity and selective behavior of the metal detector (23) can be adjusted.

19. Process for checking for the presence of metal in refuse contained in a refuse container (12), characterized in that the refuse container (12) is scanned by at least one metal detector (13, 15) at the pick-up site before being emptied and in that a signal is generated when metal is detected, and when refuse is picked up by a vehicle (10) provided with at least one lifting device (11) for refuse containers (12), detection of metal by the detector (13, 15), of which there is at least one, can trigger a locking of the lifting device.

20. Process for checking for the presence of metal in refuse contained in a refuse container (12), characterized in that the refuse container (12) is scanned by at least one metal detector (13, 15) at the pick-up site before being emptied and in that a signal is generated when metal is detected, and a readable code identifying the refuse producer is arranged on the refuse container (12) and the number of times that metal has been detected within a certain time span can be stored for each refuse producer.

21. Process for checking for the presence of metal in refuse contained in a refuse container of refuse collecting vehicle characterized in that refuse is picked up by the refuse collecting vehicle provided with at least one metal detector, the at least one metal detector is supplied with power from the refuse collecting vehicle, the refuse container is scanned by the at least one metal detector provided on the refuse collecting vehicle at the pick-up site before being emptied, and a signal is generated when metal is detected.

22. Device for metal contained in refuse collecting in container of refuse collecting vehicle, characterized in that it has means for connecting the device to the refuse collecting vehicle, at least one metal detector arranged on the refuse collecting vehicle and supplied with power from the refuse collecting vehicle, and a display device.

* * * * *